United States Patent
Witters et al.

(10) Patent No.: US 8,828,826 B2
(45) Date of Patent: Sep. 9, 2014

(54) METHOD FOR MANUFACTURING A TRANSISTOR DEVICE COMPRISING A GERMANIUM BASED CHANNEL LAYER

(71) Applicants: IMEC, Leuven (BE); Taiwan Semiconductor Manufacturing Company, Ltd., HsinChu (TW); GLOBALFOUNDRIES Inc., Grand Cayman (KY)

(72) Inventors: Liesbeth Witters, Everberg (BE); Rita Vos, Tremelo (BE); David Brunco, Hillsboro, OR (US); Marcus Johannes Henricus Van Dal, Heverlee (BE)

(73) Assignees: IMEC, Leuven (BE); Taiwan Semiconductor Manufacturing Company, Ltd., HsinChu (TW); GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 14/015,531

(22) Filed: Aug. 30, 2013

(65) Prior Publication Data

US 2014/0061735 A1  Mar. 6, 2014

(30) Foreign Application Priority Data

Sep. 3, 2012 (EP) .................................. 12182800

(51) Int. Cl.
 *H01L 21/336* (2006.01)
 *H01L 29/66* (2006.01)
 *H01L 29/45* (2006.01)
 *H01L 29/417* (2006.01)
 *H01L 29/165* (2006.01)
 *H01L 21/285* (2006.01)
 *H01L 29/78* (2006.01)
 *H01L 21/28* (2006.01)

(52) U.S. Cl.
CPC .......... *H01L 29/78* (2013.01); *H01L 29/66545* (2013.01); *H01L 21/28255* (2013.01); *H01L 29/45* (2013.01); *H01L 29/41775* (2013.01); *H01L 29/165* (2013.01); *H01L 29/66628* (2013.01); *H01L 21/28518* (2013.01); *H01L 29/41783* (2013.01); *H01L 29/6656* (2013.01); *H01L 29/665* (2013.01)
USPC ............................ 438/285; 438/300; 438/301

(58) Field of Classification Search
USPC ......................................... 438/285, 300, 301
See application file for complete search history.

(56) References Cited

U.S. PATENT DOCUMENTS

| | | | |
|---|---|---|---|
| 7,517,765 B2 | 4/2009 | Brunco et al. | |
| 8,129,234 B2 * | 3/2012 | Wallner et al. | ................ 438/204 |

(Continued)

FOREIGN PATENT DOCUMENTS

CN            101635262 A          1/2010

OTHER PUBLICATIONS

Luo, et al., "A Comprehensive Study of $Ge_{1-x}Si_x$ on Ge for the Ge nMOSFETs with Tensile Stress, Shallow Junctions and Reduced Leakage", Electron Devices Meeting (IEDM), 2009 IEEE International, IEEE, Piscataway, NJ, USA, Dec. 7, 2009, pp. 1-4, XP031644428, ISBN: 978-1-4244-5639-0.

*Primary Examiner* — Ngan Ngo
(74) *Attorney, Agent, or Firm* — Knobbe Martens Olson & Bear, LLP.

(57) ABSTRACT

A method for manufacturing a transistor device is provided, the transistor device comprising a germanium based channel layer, the method comprising providing a gate structure on the germanium comprising channel layer provided on a substrate, the gate structure being provided between a germanium based source area and a germanium based drain area at opposite sides of the germanium comprising channel layer; providing a capping layer on the germanium based source and the germanium based drain area, the capping layer comprising Si and Ge; depositing a metal layer on the capping layer; performing a temperature step, thereby transforming at least part of the capping layer into a metal germano-silicide which is not soluble in a predetermined etchant adapted for dissolving the metal; selectively removing non-consumed metal from the substrate by means of the predetermined etchant; and providing a premetal dielectric layer.

14 Claims, 9 Drawing Sheets

(56) References Cited

U.S. PATENT DOCUMENTS

| | | |
|---|---|---|
| 8,298,897 B2 * | 10/2012 | Chen et al. .................. 438/285 |
| 8,299,453 B2 * | 10/2012 | Zhu .............................. 257/19 |
| 2004/0217430 A1 | 11/2004 | Chu |
| 2005/0006637 A1 | 1/2005 | Iinuma et al. |
| 2005/0130454 A1 | 6/2005 | Murthy et al. |
| 2005/0250301 A1 | 11/2005 | Cabral et al. |
| 2007/0272955 A1 | 11/2007 | Chi et al. |
| 2008/0067609 A1 | 3/2008 | Kim et al. |
| 2008/0119025 A1 * | 5/2008 | Kwon et al. ................. 438/285 |
| 2009/0108308 A1 | 4/2009 | Yang et al. |
| 2010/0224938 A1 * | 9/2010 | Zhu .............................. 257/369 |
| 2010/0240186 A1 * | 9/2010 | Wang ........................... 438/285 |
| 2010/0244107 A1 | 9/2010 | Kronholz et al. |
| 2010/0304543 A1 | 12/2010 | Kim et al. |
| 2011/0045663 A1 | 2/2011 | Ikeda |
| 2011/0057266 A1 * | 3/2011 | Wallner et al. .............. 257/378 |
| 2011/0147809 A1 * | 6/2011 | Yang et al. .................. 257/288 |
| 2011/0223736 A1 * | 9/2011 | Lin et al. ..................... 438/305 |
| 2012/0007145 A1 * | 1/2012 | Chen et al. .................. 257/192 |
| 2012/0032275 A1 * | 2/2012 | Haran et al. ................ 257/401 |
| 2012/0037998 A1 * | 2/2012 | Bedell et al. ............... 257/369 |
| 2012/0168830 A1 | 7/2012 | Usuda et al. |
| 2012/0190160 A1 * | 7/2012 | Chen et al. .................. 438/285 |
| 2013/0122674 A1 * | 5/2013 | Lin et al. ..................... 438/285 |
| 2013/0234217 A1 * | 9/2013 | Lin et al. ..................... 257/288 |
| 2013/0256757 A1 * | 10/2013 | Cai et al. ..................... 257/197 |
| 2013/0260526 A1 * | 10/2013 | Cai et al. ..................... 438/311 |
| 2014/0061735 A1 * | 3/2014 | Witters et al. ............... 257/288 |

* cited by examiner

METHOD FOR MANUFACTURING A TRANSISTOR DEVICE COMPRISING A GERMANIUM BASED CHANNEL LAYER

INCORPORATION BY REFERENCE TO RELATED APPLICATIONS

Any and all priority claims identified in the Application Data Sheet, or any correction thereto, are hereby incorporated by reference under 37 CFR 1.57. This application claims priority to European Application No. 12182800.8 filed Sep. 3, 2012. Each of the aforementioned applications is incorporated by reference herein in its entirety, and each is hereby expressly made a part of this specification.

TECHNICAL FIELD

The embodiments relate generally to field-effect semiconductor devices, such as field-effect transistors (FETs).

BACKGROUND ART

Several challenges still remain for large scale integration of field-effect semiconductor devices. As FET transistor gate lengths continue to scale down, the processes to define them are increasingly difficult to control in order to achieve the desired critical dimensions.

Today, in the field of silicon based FET transistor devices, a self-aligned silicide process is usually included to reduce the resistance of the S/D regions and silicon gates. It typically comprises a preclean process, a metal deposition process and an anneal process to form a metal silicide alloy, followed by a wet selective etch to remove the non-reacted metal. During such a wet etch process, any exposed silicon surface (e.g. a silicon channel layer) automatically forms a thin passivating silicon oxide at its surface, protecting the underlying silicon from being affected.

When manufacturing germanium based FET transistors, e.g., on a germanium substrate, a similar germanidation process has been developed in the state of the art. Here, void formation is a major issue when applying a germanidation process straight on a germanium surface. Such a germanidation process typically comprises a preclean process, a metal deposition process and an anneal process to form a metal germanide alloy, followed by a wet selective etch to remove the non-reacted metal. While the annealing temperature can be optimized to eliminate void formation caused by diffusion of Ge into the metal (e.g. Ni or NiPt) during the germanidation reaction itself (see for instance in U.S. Pat. No. 7,517,765), voids can still be formed during the selective etch for removing the non-reacted metal, which may be problematic.

SUMMARY OF THE DISCLOSURE

The general problem is that germanium is susceptible to galvanic corrosion in aqueous solutions when in contact with a more noble metal. In the particular case of the germanide module, the germanium serves as an anode 60 in a galvanic reaction while the more noble metal (e.g., NiGe, Ni, NiPtGe, NiPt) serves as the cathode 61 (illustrated in FIG. 1). The void formation or pitting 62 can be quite severe as the area of the Ge exposed to the aqueous chemistry is small, resulting in high galvanic current densities and thus high local corrosion rates. As germanium oxide is water soluble, a thin passivating oxide layer cannot form. This is very different from the known silicidation process for silicon based FET transistors, for which $SiO_2$ is not water soluble and is passivating in most aqueous solutions.

Certain embodiments provide an improved method for manufacturing a transistor device comprising a germanium based channel layer and germanium based source and drain areas by means of a germanidation process, which reduces or avoids void formation.

This can be achieved by the method showing the technical characteristics of the first independent claim.

According to a first embodiment, a method for manufacturing a transistor device comprising a germanium or germanium based channel layer is disclosed, the method comprising: providing a gate structure on said germanium based channel layer provided on a substrate (for instance a germanium substrate, or a Si substrate with an epitaxial layer comprising Ge, or a $Si_xGe_{1-x}$ [0≤x≤1] on Insulator substrate), the gate structure being provided between a germanium based source area and a germanium based drain area at opposite sides of the germanium based channel layer; providing a capping layer on the germanium based source area and germanium based drain area, the capping layer comprising silicon and germanium, e.g. comprising SiGe; depositing a metal layer on the capping layer; performing a temperature step, for instance an anneal step, thereby transforming at least part of the capping layer into a metal germano-silicide which is not soluble in a predetermined etchant adapted for dissolving the deposited metal layer; selectively removing a non-consumed metal layer from the substrate by means of the predetermined etchant; providing a premetal dielectric layer.

It is an advantage that by providing the capping layer on the source and drain areas, before performing a germanidation process, void formation in the germanium based channel and/or source and drain areas can be reduced or avoided, as it prevents exposure of the germanium of the channel layer and source and drain areas and potentially other germanium based layers during the selective removing (e.g. etch) of the non-consumed metal layer. Preferably, an upper part of the capping layer reacts with the metal layer, while another, typically lower, unreacted part can function as an etch stop layer during the selective removing (e.g. etch) of the non-consumed metal layer.

According to certain embodiments, the method further comprises patterning the premetal dielectric layer such that open areas are created and filling the open areas with electrically conductive materials to connect source and drains to metallization lines.

The premetal dielectric layer can for instance be a silicon oxide layer or a stack of silicon oxide/silicon nitride layer or a low-k dielectric.

The channel layer can be a germanium based channel layer. It can for instance be a layer comprising more than 80%, or more than 90%, or more than 95%, or more than 99% germanium or can consist of 100% germanium.

Each of the source and drain areas can be germanium based. They can for instance be a layer comprising more than 80%, or more than 90%, or more than 95%, or more than 99% germanium or can consist of 100% germanium.

Providing a capping layer on at least the source and the drain areas, may also comprise providing the capping layer in the area between the gate structure and the source and drain areas respectively.

Providing a temperature step may comprise providing a temperature between 150° C. and 450° C. More preferably it may be a temperature between 200° C. and 400° C. Even more preferably, it may be between 250° C. and 400° C. Even more preferably, it may be a temperature between 250° C. and 350° C.

According to an embodiment, a method comprises performing depositing the metal layer on the capping layer; performing the temperature step, thereby transforming at least part of the capping layer into a metal germano-silicide; selectively removing the non-consumed metal or metal layer from the substrate; before depositing the premetal dielectric layer.

This provides the advantage that the distance between the metal germano-silicide and the channel can be minimized. The distance can be mainly or completely determined by the spacer width.

According to alternative embodiments, the method comprises performing depositing the metal layer on the capping layer; performing the temperature step, thereby transforming at least part of the capping layer into a metal germano-silicide; selectively removing the non-consumed metal from the substrate; after depositing the premetal dielectric layer and patterning openings in the premetal dielectric layer.

Postponing the formation of the metal germano-silicide until later in the process flow provides the advantage that other processing modules can be performed at process conditions, for instance temperatures, that the metal germano-silicide could not withstand. Such a process can be for instance a replacement metal gate process.

According to certain embodiments, the method further comprises replacing the gate structure by a final gate structure.

According to certain embodiments, replacing the gate structure by a final gate structure is performed after depositing the premetal dielectric layer, and for instance before patterning the premetal dielectric layer to expose the capping layer.

According to certain embodiments, the gate structure comprises one or more dielectric layers and a conductive electrode comprising one or more metal layers and/or a doped polycrystalline silicon layer. The gate structure is laterally limited by spacer structures, while the gate abuts on the germanium-comprising channel layer. The spacer structures may for instance comprise or consist of silicon nitride, a silicon oxide or a combination of both.

According to certain embodiments, the metal layer comprises or consists of Ni or Pt or both Ni and Pt, for instance a combination of Ni and Pt, or comprises of consists of Pd or Cu or both Pd and Cu, for instance a combination of Pd and Cu.

Possible etchants corresponding therewith can be for instance hot HCl.

According to certain embodiments, providing the capping layer, e.g. SiGe layer, comprises epitaxially growing on the germanium based source and drain areas.

According to certain embodiments, the method comprises growing the capping layer, e.g. SiGe layer, in a substantially facet-free mode. As described further below, alternatively, the method may comprise covering the formed facets of the SiGe layer by an extra spacer to avoid reaction of the metal on the facets.

According to certain embodiments, the deposited metal layer is provided such that, for instance with a predetermined thickness and/or at predetermined locations, after the germanidation process (comprising depositing the metal layer on the capping layer and performing the temperature step), transforming at least part of the capping layer into a metal germano-silicide, a non-consumed (or unreacted or untransformed) portion of the capping layer remains covering the underlying germanium (preferably germanium based source and drain areas, but other, non-channel, germanium areas on the substrate may also be covered/protected), and thus protecting the underlying germanium from galvanic corrosion during the selective removing of the non-consumed or non-reacted metal layer from the substrate.

According to certain embodiments, the deposited metal layer has a predetermined thickness (for instance a thickness smaller than) with respect to the thickness of the capping layer comprising SiGe. In typical cases this would imply that not all of the capping layer would be consumed by interacting with the metal layer, such that a layer or portion of unreacted SiGe (or silicon, in case of a particular embodiment with a graded SiGe capping layer or bilayer having an 100% silicon bottom layer) remains covering and thus protecting the underlying germanium from galvanic corrosion. Preferably, the layer or portion of unreacted SiGe or Si of the capping layer has a thickness of at least 1 nm.

For instance, a 1 nm thick layer of Ni would consume an approximately 2 nm thick layer of $Si_xGe_{1-x}$ (x in between 0 and 1), to form low resistance $NiSi_xGe_{1-x}$ phase. In order to have an unreacted or untransformed portion of the capping layer remaining, covering the underlying germanium, in this case the capping layer preferably has a thickness larger than 2 nm, e.g. 3 nm.

According to certain embodiments, the capping layer is adapted for preventing any exposure of the germanium based channel layer and source and drain areas to the predetermined etchant.

According to certain embodiments, the capping layer comprises Si and Ge, for instance SiGe, and comprises between 20 and 100% silicon. It is an advantage that a capping layer comprising enough silicon can suppress the germanium diffusion into the metal (e.g. Ni, NiPt) during the germanosilicide formation, and thereby also further addresses the problem of void formation during the anneal.

The capping layer can have a uniform composition, and preferably comprises a germanium concentration below 70%, even more preferably below 50%. The capping layer may also comprise a non-uniform composition with depth such that the lower portion of the cap has a higher silicon concentration than the upper portion. For instance, the capping layer may comprise or consist of a bilayer, and may comprise a first sub-layer, a bottom layer, comprising a germanium concentration below 50%. The first sub-layer may comprise a silicon concentration higher than 50%. The capping layer can comprise a second sub-layer, a top layer, with a higher Germanium concentration, for instance above 50%, or above 70%. The first (bottom) sub-layer can be adapted to act as an etch-stop layer or sealing layer for, while the second (top) sub-layer may be adapted for optimally reacting with the metal layer. The capping layer can also be a graded layer with an increasing amount of germanium as the deposition thickness is increased. A bottom layer or lower portion of the graded capping layer can correspond to the first sub-layer as described for the bilayer embodiments. A top layer or upper portion of the graded capping layer can correspond to the second sub-layer as described for the bilayer embodiments. An intermediate graded portion may be provided in between such a top and bottom layers of the graded capping layer.

The capping layer may further comprise C, Sn. The capping layer may further comprise, for instance, dopants such as B, In, P, As, or Sb.

The capping layer can for instance have a thickness of at least 5 nm. It can have a thickness within the range of 5 nm to 30 nm.

According to certain embodiments, the method further comprises forming a spacer after growing the capping layer, e.g., SiGe layer, to cover any thin SiGe areas which may be present due to faceted SiGe growth, before depositing of the metal or metal layer. A thin area can be an area which would completely be consumed in the thickness direction, i.e., from the front surface of the capping layer up until the germanium based channel layer or source and drain areas, after depositing a predetermined metal layer on the capping layer and performing the temperature step. This would result in the fact that no unreacted portion of the capping layer is left in the thin area on the germanium based channel layer and/or source/drain areas, to protect the germanium based channel layer or source/drain areas.

This spacer may be performed by processes known to the person skilled in the art.

The spacer can comprise or can consist of a dielectric stack, e.g. silicon oxide or/and silicon nitride or any other low-k material that does not react with the metal used for the metal-silicon-germanium alloy.

According to certain embodiments, the (patterned) premetal dielectric layer serves to prevent any exposure of the germanium based channel layer and germanium based source and drain areas to the predetermined etchant. This can be achieved for instance by making a hole in the premetal dielectric in which the capping layer is opened up for reaction with the subsequently deposited metal, while the premetal dielectric is left covering any thin SiGe capping areas that may be present due to faceted SiGe growth. According to certain embodiments, the method comprises performing a second temperature step (a $2^{nd}$ anneal) after the selective etch (the removing of the non-consumed metal layer from the substrate) in order to reduce the resistance and/or improve the device properties of the metal germano-silicide.

According to a second aspect, a microelectronic device, for instance a transistor device or a device related to a transistor device as for instance an intermediate device while manufacturing a transistor device, is described comprising a germanium or germanium based channel layer on a substrate; a gate structure on the germanium based channel layer, the gate structure being positioned between a germanium based source and a germanium based drain area at opposite sides of the germanium based channel layer; a partially transformed capping layer on the source and/or drain area respectively only a portion of which comprises a metal germano-silicide.

The portion which comprises a metal germano-silicide can be an upper portion or upper sublayer of the partially transformed capping layer. The partially transformed capping layer can further comprise silicon and/or germanium, for instance silicon germanium, preferably at its lower portion. The lower portion can be a lower sublayer.

It will be appreciated by the skilled person that features and advantages described for the first aspect are also applicable, mutatis mutandis, to the second aspect and vice versa and are thereby also considered to be disclosed.

BRIEF DESCRIPTION OF THE DRAWINGS

The disclosure will be further elucidated by means of the following description and the appended figures.

DETAILED DESCRIPTION OF THE EMBODIMENTS

Figure 1:
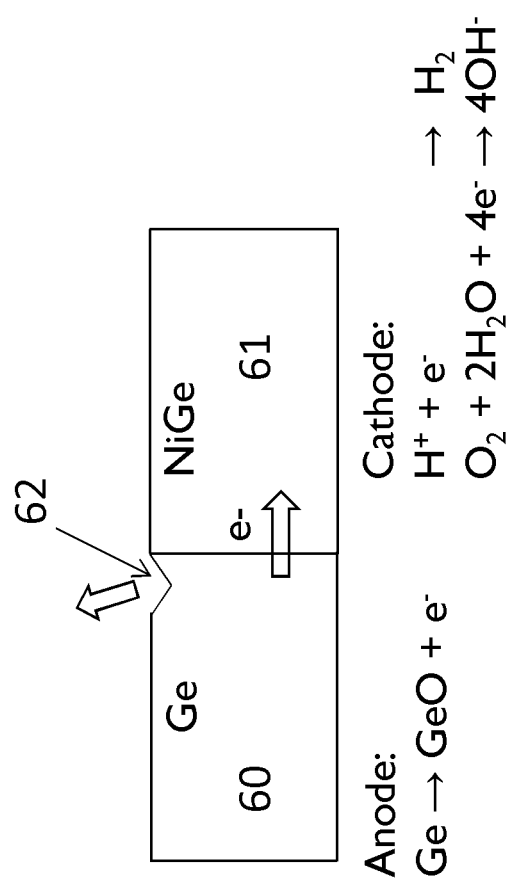
FIG. 1 illustrates the anodizing process occurring in the state of the art germanidation process.

The various embodiments will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the certain embodiments.

Furthermore, the terms first, second, third and the like in the description and in the claims, are used for distinguishing between similar elements and not necessarily for describing a sequential or chronological order. The terms are interchangeable under appropriate circumstances and the embodiments can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments described herein can operate in other orientations than described or illustrated herein.

Furthermore, the various embodiments, although referred to as "preferred" are to be construed as exemplary manners in which the aspects of the embodiments may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

FIG. 1 illustrates the fact that germanium is susceptible to galvanic corrosion in aqueous solutions when in contact with a more noble metal. In the particular case of the germanide module, the germanium serves as an anode 60 in a galvanic reaction while the more noble metal (e.g., NiGe, Ni, NiPt) serves as the cathode 61 (illustrated in FIG. 1). The "more noble" metal is considered to be the metal with the higher standard electrode potential.

Figure 2:
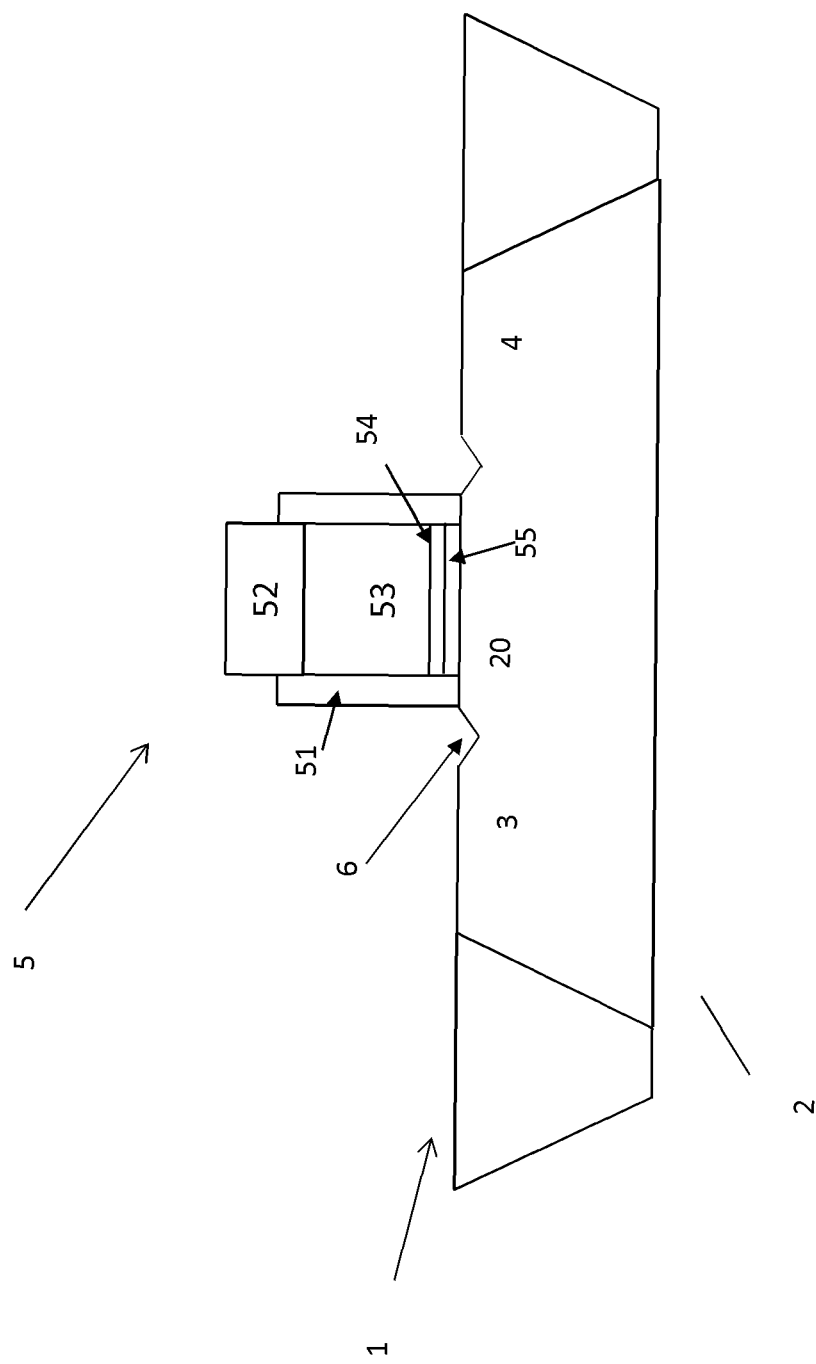
FIG. 2 illustrates a state of the art germanium based FET transistor device produced by methods according to the state of the art, comprising voids in the germanium based source/drain areas.

FIG. 2 illustrates a typical germanium based FET transistor device. On or in a substrate, e.g. a germanium substrate, 2 a FET transistor device 1 is provided. The substrate 2 comprises a channel layer or region 20, which connects a source region 3 with a drain region 4. On top of the channel region 20 a gate structure 5 is provided, in between the source region and the drain region. The gate structure 5 comprises a dielectric layer or layer stack 55, a metal layer 54, a polycrystalline silicon layer 53, and another dielectric layer 52 (for instance a silicon oxide layer). Laterally the stack is confined by a spacer structure or spacer 51, for instance a silicon nitride spacer.

According to prior art manufacturing methods, voids 6 are created and visible in the source and drain areas 3,4 after reaction of a metal with the source-drain germanium material and the subsequent wet removal of the unreacted metal.

It is a general advantage of certain embodiments that exposure of germanium which is in contact with a more noble metal during wet (aqueous) processes can be avoided, in order to suppress pitting in the germanium.

Figure 3:
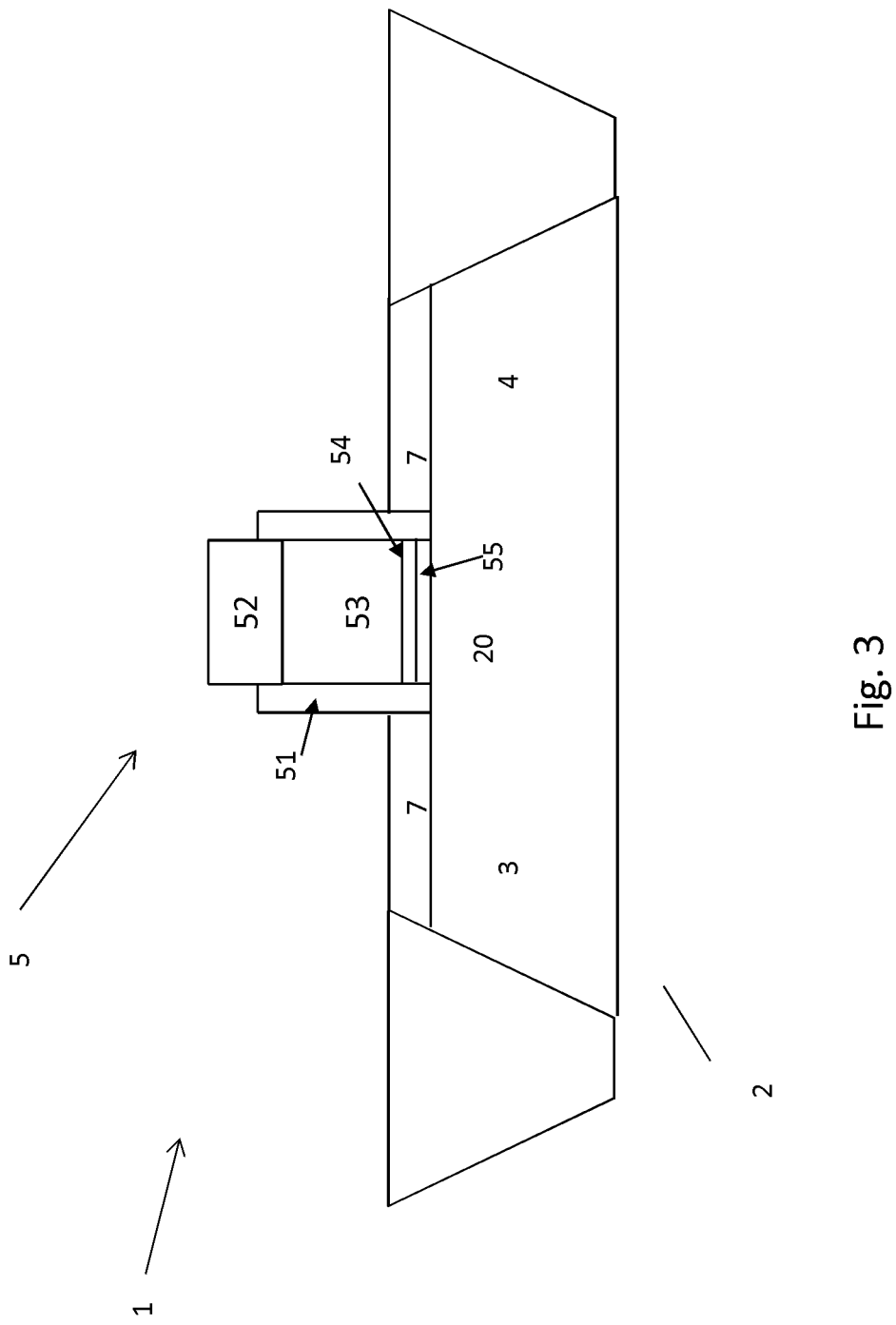
FIG. 3 illustrates a first embodiment including a SiGe (or similar) capping layer on top of the Ge layer, where the layer is grown in a substantially facet-free mode.

According to certain embodiments, a SiGe (or similar) capping layer 7 on top of the Ge layer (which can for instance constitute the germanium based channel layer and germanium based source and drain areas) is used, as illustrated in FIG. 3, where the layer 7 is grown in a substantially facet-free mode. Alternatively, any formed facets of the SiGe layer can be covered by an extra spacer to avoid reaction of the metal on the facets.

After germano-silicide formation a portion of the capping layer remains that has a sufficiently high Si content to act as a sealing layer for the germanium during the selective etch. A relatively high silicon content is then preferred, as $SiO_2$ is not water soluble and thus forms a good passivation layer.

The growth of a capping layer (e.g., SiGe) before the metal deposition prevents germanium exposure to the aqueous solution during the selective etch where an excess of metal is removed. At least part of this capping layer reacts with the metal (e.g., Ni, NiPt) during the germanidation reaction and the unreacted part can serve as a stopping (sealing) layer to prevent exposure of the germanium to the wet etchant during the selective etch. This layer can be comprised primarily of Si, Ge, C, and Sn, but may also comprise dopant atoms, e.g., B, In, P, As, and Sb. If this layer is uniform in composition, the Ge concentration can be less than 70% and preferably less than 50%. According to certain embodiments, the composition of the layer may also be nonuniform in depth, where the upper part which is adapted for reacting with the metal (e.g., Ni) may comprise a high Ge concentration (>50%) whereas the lower, non-reacting part may comprise a high Si concentration (>50%) to serve as the sealing layer.

The above mentioned capping layer is preferably such that it can grow selectively on Ge, but does not grow on dielectric materials for instance (e.g., SiO2, SiN, SiON, C). The above mentioned capping layer may also be grown non-selectively, but must be subsequently removable from areas where it would be detrimental to device operation, using, for example, a chemical mechanical polish (CMP) operation.

Figure 4:
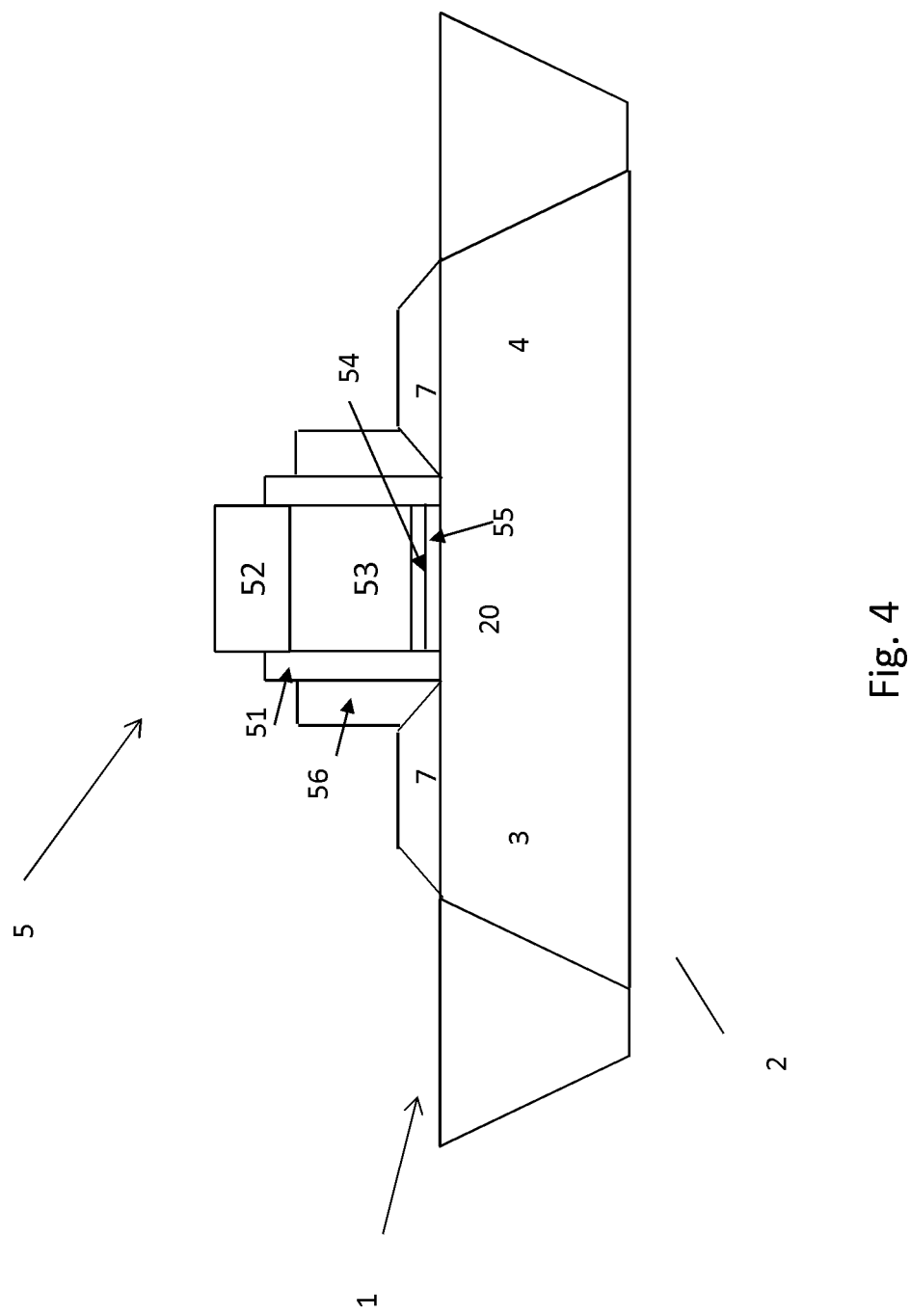
FIG. 4 illustrates a second embodiment, for instance based on the first embodiment, but with a SiGe (or similar) capping layer on top of the Ge layer grown with facets.

According to certain embodiments, a SiGe (or similar) capping layer 7 on top of the Ge layer can also be grown with facets, as illustrated in FIG. 4. In this case, the facet on layer 7 can be covered with an extra spacer layer 56 to avoid reaction of the metal on the thin SiGe layer in the facet.

Figure 5:
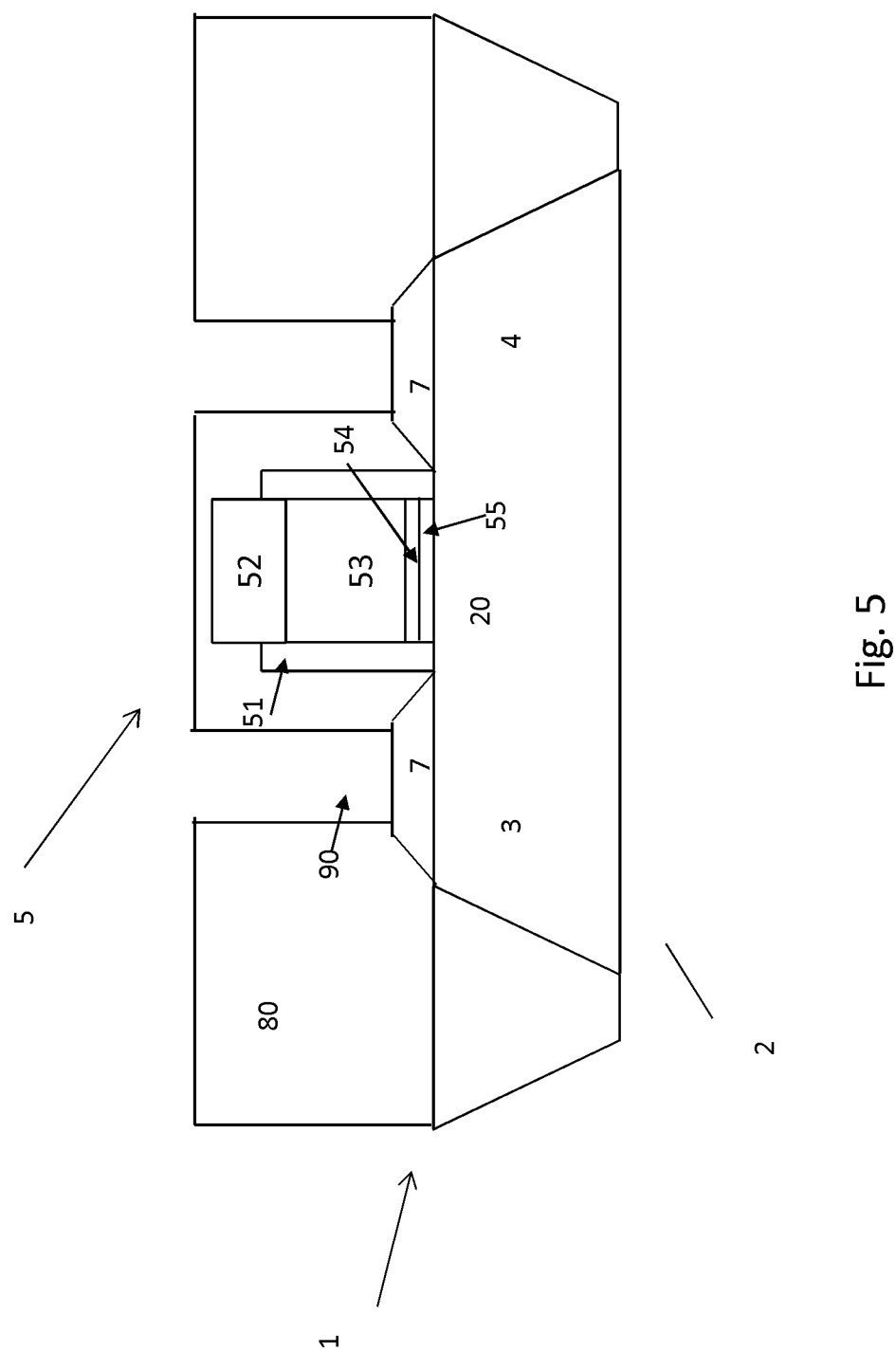
FIG. 5 illustrates a third embodiment, for instance based on the first embodiment, where the facet is covered by a premetal dielectric layer, in which openings are provided.

In FIG. 5 the facet is covered by a premetal dielectric layer 80, in which openings 90 are provided. The opening 90 does not overlap on the facet of layer 7, i.e. the facets remain covered with the premetal dielectric layer 80. As such, the premetal dielectric layer 80 covers the facets of layer 7.

Figure 6:
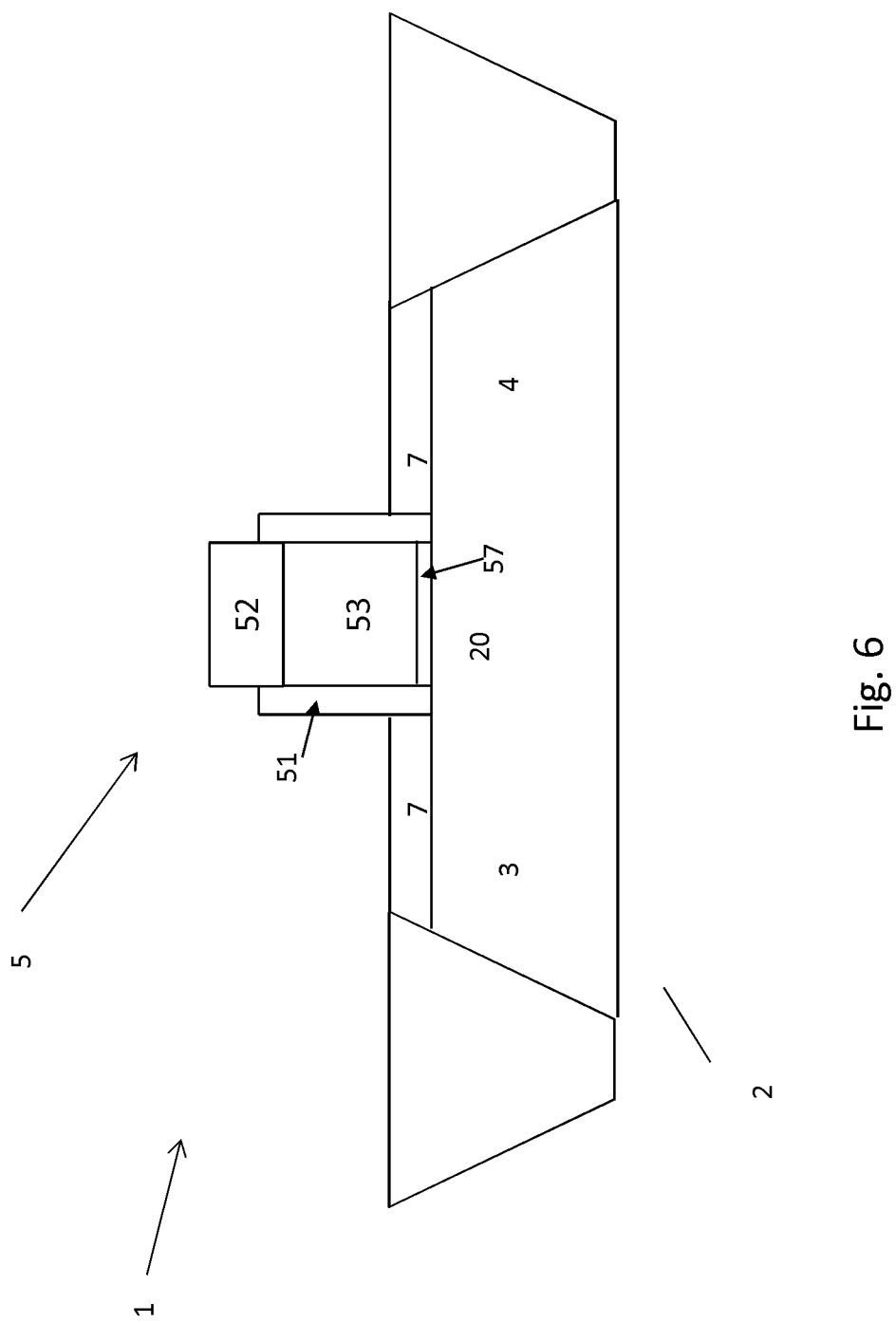
FIG. 6 illustrates fourth embodiment, similar to that of FIG. 3, but where a replacement gate process is used.
Figure 7:
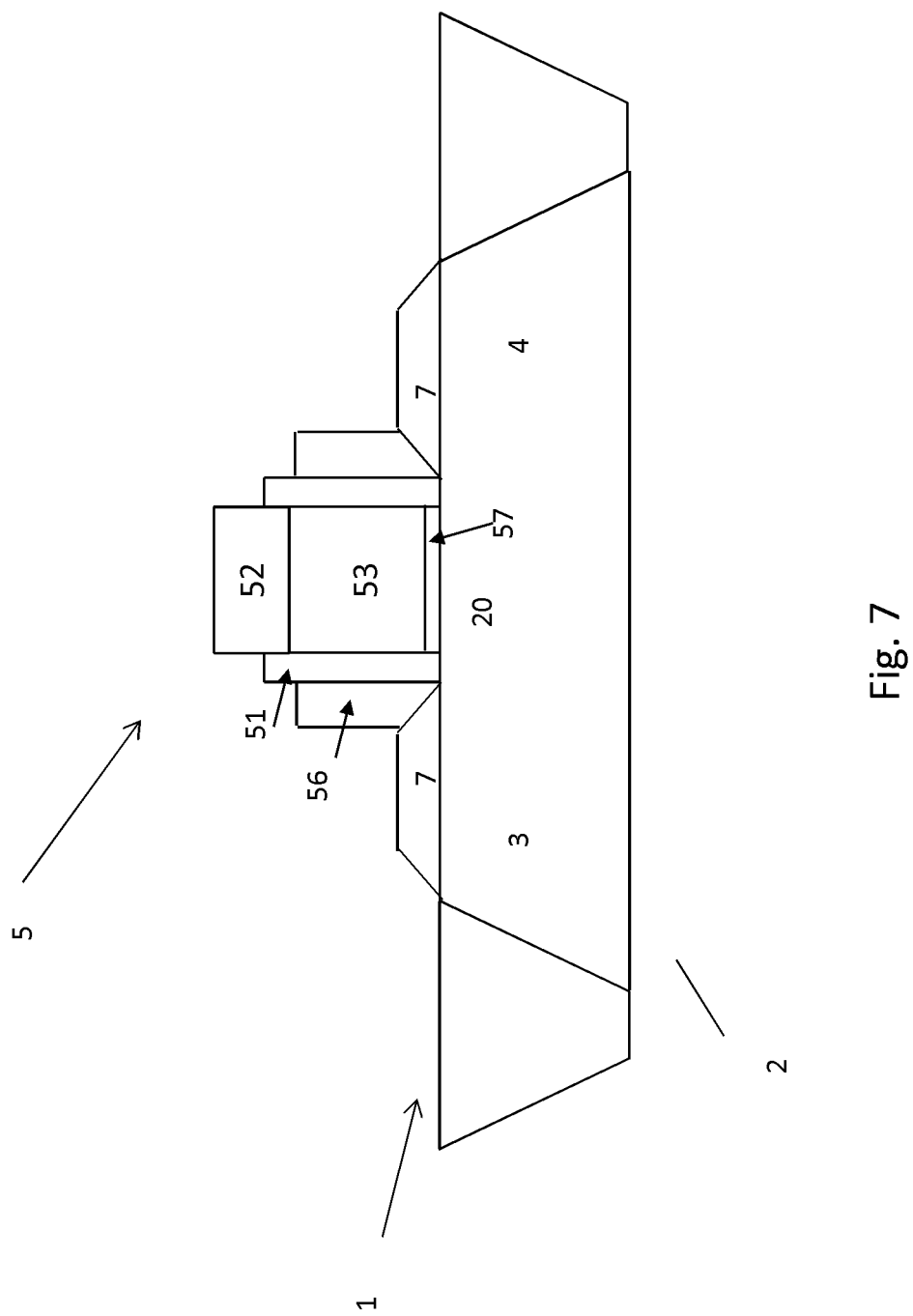
FIG. 7 illustrates a fifth embodiment, similar to that of FIG. 4, but where a replacement gate process is used.
Figure 8:
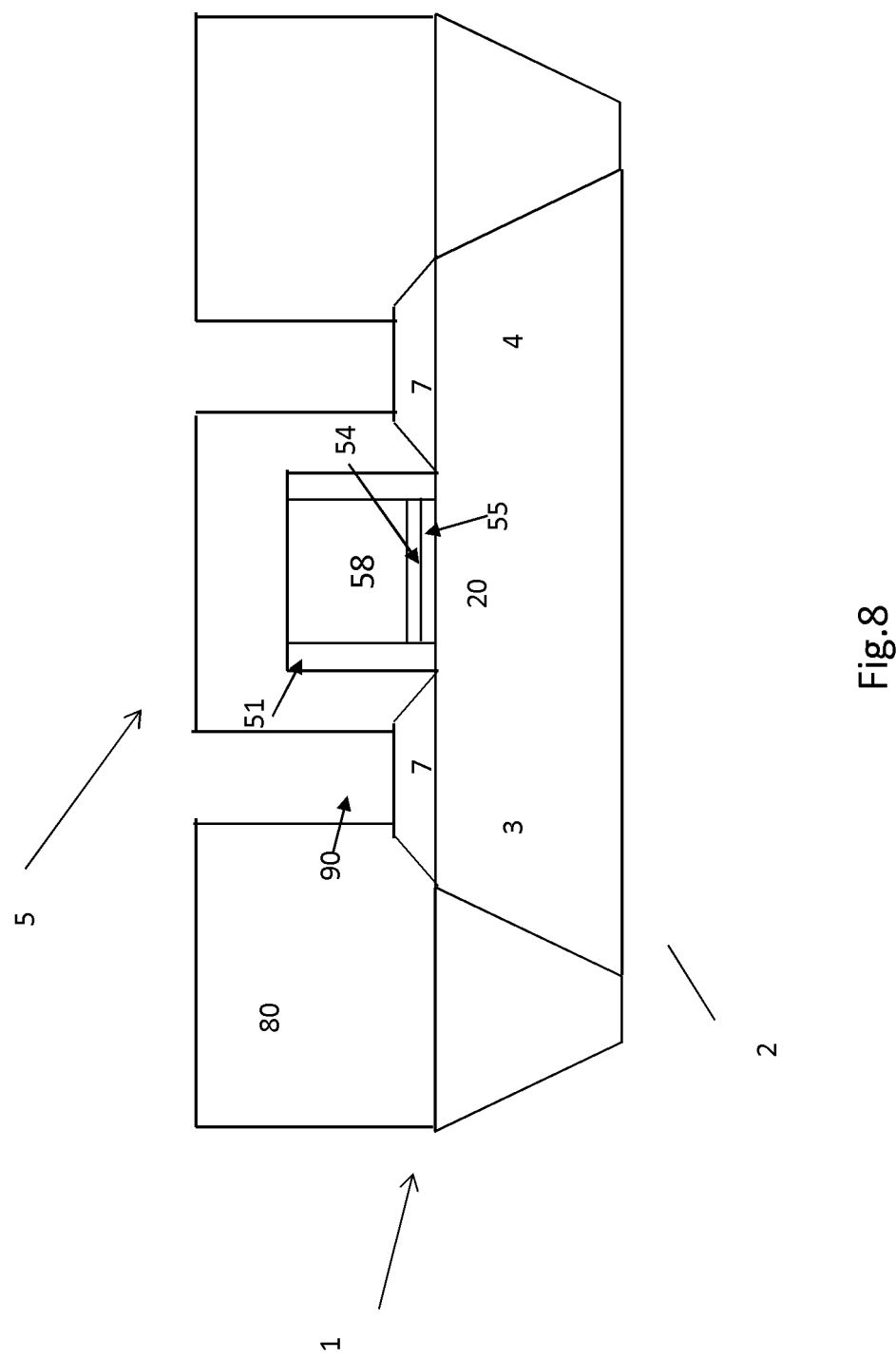
FIG. 8 illustrates a sixth embodiment, similar to that of FIG. 5, but where a replacement gate process is used.

The embodiments depicted in FIGS. 6 to 8 are equivalent to those of FIGS. 3 to 5 respectively for the integration approach where a replacement gate process is used. In case the formation of the metal-germanium-silicide complex is done prior to the gate removal process, the gate stack at the moment of the germano-silicidation consists out of a dummy dielectric layer 57 and dummy polysilicon gate layer 53.

In FIG. 8, the formation of openings 90 in the premetal dielectric layer 80 and subsequent formation of the metal-germanium-silicide complex is done after the replacement gate process. In this case, the gate stack consists of the final dielectric layer 55, optional metal layer 54 and metal layer 58.

Figure 9:
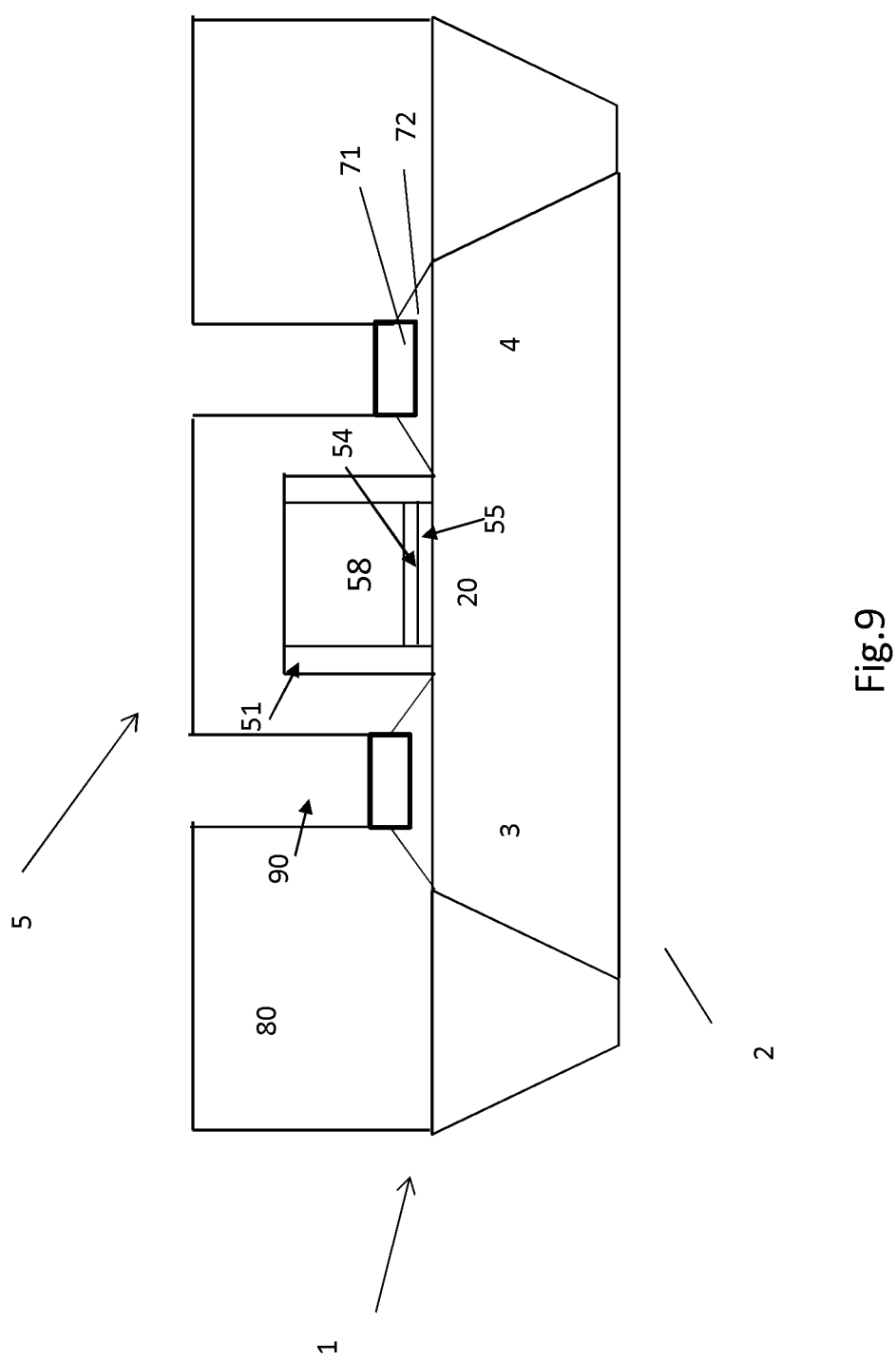
FIG. 9 illustrates an embodiment based on a further processing of the embodiment according to FIG. 8.

The device depicted in FIG. 9 results from further processing the device according to FIG. 8. A metal layer is provided on the capping layer 7 within the opening 90. An anneal step causes the partial consumption of the capping layer 7, and results in a remaining portion 72 of the original capping layer with on top a metal germano-silicide portion 71. The remaining unreacted portion of the metal layer can then be removed before contacts to the source and drain areas are formed through the premetal dielectric layer.

What is claimed is:

1. A method for manufacturing a transistor device comprising a germanium based channel layer, comprising:
    providing a gate structure on a germanium based channel layer provided on a substrate, the gate structure being provided between a germanium based source area and a germanium based drain area at opposite sides of the germanium based channel layer;
    providing a capping layer on the germanium based source area and the germanium based drain area, the capping layer comprising Si and Ge;
    depositing a metal layer on the capping layer;
    performing a temperature step, whereby at least part of the capping layer is transformed into a metal germano-silicide which is not soluble in a predetermined etchant configured for dissolving the metal;
    selectively removing non-consumed metal from the substrate using the predetermined etchant; and
    providing a premetal dielectric layer.

2. The method according to claim 1, wherein depositing the metal layer on the capping layer, performing the temperature step, and selectively removing the non-consumed metal from the substrate using the predetermined etchant are performed before depositing the premetal dielectric layer.

3. The method according to claim 1, wherein depositing the metal layer on the capping layer, performing the temperature step, and selectively removing the non-consumed metal from the substrate using the predetermined etchant are performed after depositing and patterning openings in the premetal dielectric layer.

4. The method according to claim 1, further comprising replacing the gate structure by a final gate structure.

5. The method according to claim 4, wherein replacing the gate structure by a final gate structure is performed after depositing the premetal dielectric layer.

6. The method according to claim 1, wherein the metal layer comprises a metal or metals selected from the group consisting of Ni, Pt, Pd, Cu, a combination of Ni and Pt, and a combination of Pd and Cu.

7. The method according to claim 1, wherein providing the capping layer comprises epitaxially growing the capping layer on the germanium based source area and the germanium based drain area.

8. The method according to claim 1, wherein an unreacted or untransformed portion of the capping layer remains covering the underlying germanium based channel layer after performing the temperature step.

9. The method according to claim 1, wherein the capping layer comprises SiGe and contains between 20% and 100% silicon.

10. The method according to claim 9, further comprising forming a spacer after growing the capping layer to cover any thin SiGe areas present due to faceted SiGe growth, before depositing the metal layer on the capping layer.

11. The method according to claim 1, comprising growing the capping layer in a substantially facet-free mode.

12. The method according to claim 1, wherein the capping layer is configured to prevent any exposure of the germanium based channel layer, the germanium based source area, and the germanium based drain area to the predetermined etchant.

13. The method according to claim 1, wherein the capping layer has a thickness of at least 5 nm.

14. The method according to claim 1, wherein the premetal dielectric is configured to prevent any exposure of the germanium based channel layer, the germanium based source area, and the germanium based drain area to the predetermined etchant.

* * * * *